(12) United States Patent
Huang

(10) Patent No.: US 6,456,167 B1
(45) Date of Patent: Sep. 24, 2002

(54) QUADRATURE OSCILLATOR

(75) Inventor: Tzuen-Hsi Huang, Tou-Liu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 09/615,410

(22) Filed: Jul. 13, 2000

(51) Int. Cl.[7] .................................................. H03B 5/02
(52) U.S. Cl. ................ 331/46; 331/177 V; 331/117 FE; 331/117 R; 331/45; 331/135
(58) Field of Search ............................. 331/46, 117 R, 331/177 V, 117 FE, 45, 135, 167

(56) References Cited

U.S. PATENT DOCUMENTS 5,714,911 A * 2/1998 Gilbert ........................ 331/57
5,912,596 A * 6/1999 Ghoshal .................. 331/117 R

* cited by examiner

Primary Examiner—Arnold Kinkead
(74) Attorney, Agent, or Firm—W. Wayne Liauh

(57) ABSTRACT

A quadrature oscillator for generating quadrature and differential double-frequency signals is disclosed. This oscillator is formed by PMOS and NMOS transistors, complementary devices, etc. The circuit is designed by using the differential circuit structures, two LC tanks and the technology of current reuse. As the current pass through most devices and selectively coupling the specific terminals, therefore, it has advantages of less area requirement in circuit design, low power dissipation and low phase noise of output.

18 Claims, 8 Drawing Sheets

QUADRATURE OSCILLATOR

BACKGROUND OF THE INVENTION

1. Field of Invention

The present invention relates to a quadrature oscillator, more particularly, to an an oscillator for generating four quadrature signals. The quadrature oscillator of the present invention can be advantageously applied in electronic circuit and communication system.

2. Related Art

Quadrature signals play an important role in the modulation mechanism of advance communication system. For example, the image signals will automatically disappear by mixing with quadrature signals. Application of this technique for communication circuit will lower the cost of having to use filters. However, quadrature signals are usually generated from RC phase shifters and quadrature oscillators.

Oscillator is an electronic apparatus, which can generate continuous (or discrete) sinusoidal or impulse waveforms. Oscillators of sinusoidal generator usually includes LC tanks, amplify circuit and feedback circuit, and which are widely used in circuit and communication system.

The conventional quadrature generators are formed by coupling RC phase shifters with quadrature oscillators. The RC phase shifter inputs a signal from single-phase oscillator to two RC-CR circuits, which are connected in series, for generating two continuous quadrature signals which are 90 degrees out of phase relative to each other. Poly-phase filters are formed by suitable connection of resistors and capacitors in series. We can obtain quadrature signals from poly-phase filters by inputting differential frequency.

FIG. 1(A) is the conventional quadrature signal generator formed by RC phase shifters. FIG. 1(B) is the conventional quadrature signal generator formed using poly-phase filters. The quadrature signal generators, which are formed by the RC phase shifters or the poly-phase filters, contain resistors and capacitors. However, the signal's amplitude will be attenuated due to these passive devices (resistors and capacitors). Therefore, additional power compensation circuit will be needed. The degree of device matching can affect the central frequency, amplitude and phase-error.

The quadrature generator, which is formed from differential oscillators, is composed of active devices. For example, the feedback circuit of two differential oscillators, which are formed by BJT and CMOS, can generate four quadrature signals.

FIG. 2 is a well-known differential oscillator formed from quadrature generators. Basically, this quadrature generator, which is formed from differential oscillators, needs four inductors and four branch constant-current sources. Thus, it requires a larger area for circuit layout and involves more power dissipation.

SUMMARY OF THE INVENTION

This invention relates to a quadrature oscillator for generating four quadrature signals and differential double-frequency signals. It has the advantages of requiring less circuit area and less power dissipation, and reduces the phase-error of the output signal by coupling the two output terminals having a constant-current source.

Even though the examples of present invention as disclosed above are very descriptive, however, they are not limitative of the present invention. Any person with skills in these techniques can make certain changes and modifications, within the claims and spirit of this invention, for more applications. Therefore, the protections of this invention are according to the claims provided at the end of this disclosure.

BRIEF DESCRIPTION OF THE DRAWINGS

The present invention will become more fully understood from the detailed descriptions given below are for illustration only, and thus are not limitative of the present invention, and wherein.

DETAILED DESCRIPTION OF THE INVENTION

Figure 3:
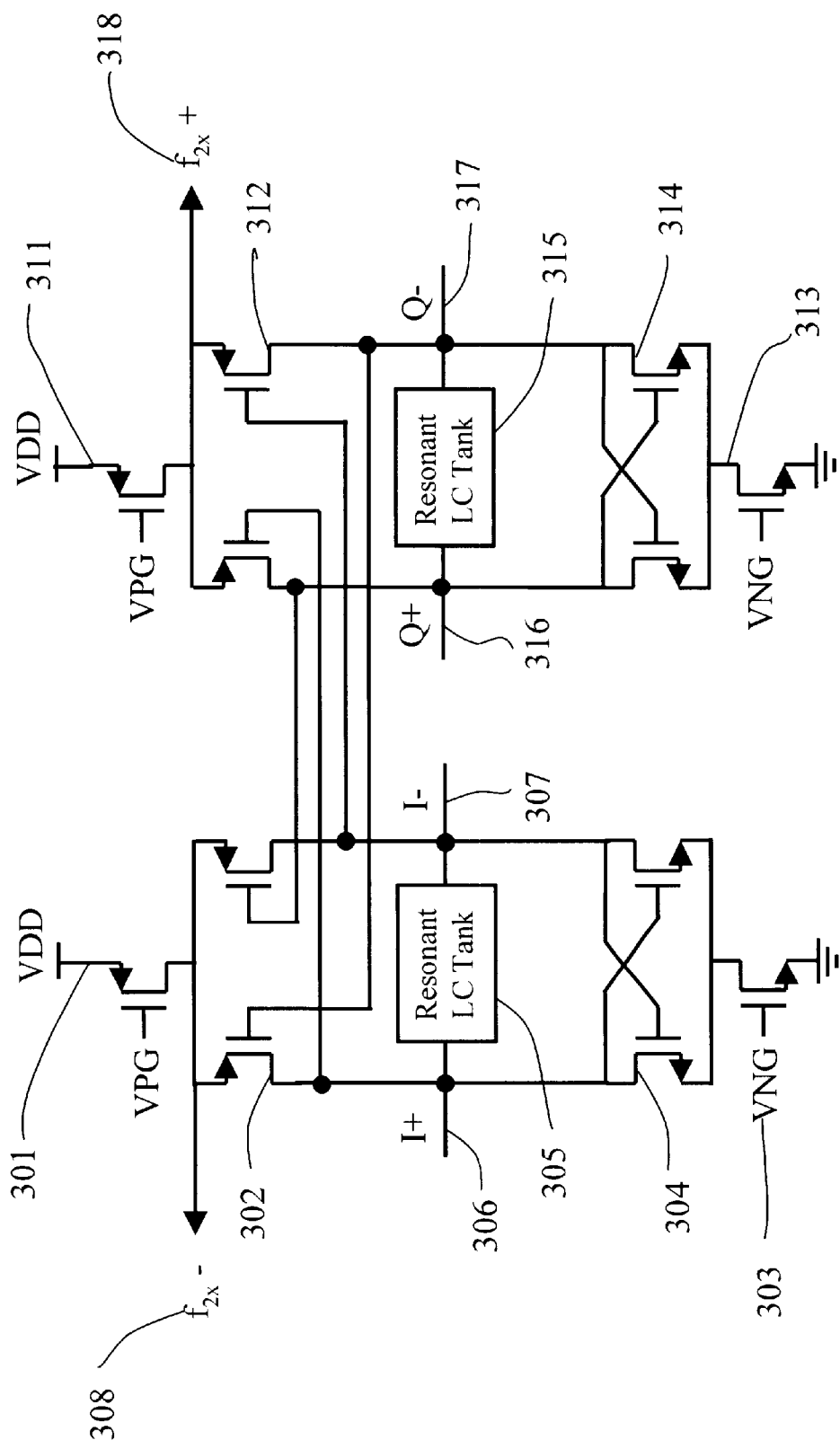
FIG. 3 is the first example of the quadrature oscillator according to the disclosed invention.

Referring now to FIG. 3, the first example of the quadrature oscillator of the present invention includes a first constant-current source 301, a first common-sourced P-type metal oxide semiconductor (PMOS) transistor set 302, a second constant-current source 303, a first common-sourced N-type metal oxide semiconductor (NMOS) transistor set 304, a first LC tank 305, a third current 311, a second common-sourced PMOS transistor set 312, a forth current source 313, a second common-sourced NMOS transistor set 314, and a second LC tank 315.

Therein, the first current source 301 and the third constant-current source 311 each are formed by a PMOS transistor, and each source terminal is connected to a constant current-source voltage VDD, and each gate is connected to a P-type constant current-controlled voltage, then each drain produce a constant current.

The source terminals of the first common-sourced PMOS transistor set 302 and the second common-sourced PMOS transistor set 312 are coupled to the first constant current-source 301 and the third constant current-source 311, respectively, the gates and drains are cross-coupled to form a feedback circuit. For example, the first drain of 302 is coupled to the first gate of 312, and the first drain of 312 is coupled to the second gate of 302; on the other hand, the second drain of 302 is coupled to the second gate of 312, and the second drain is coupled to the first gate of 302.

The second current source 303 and the fourth current source 313 each are formed by a NMOS transistor, which sources are connected to ground, and the gates are connected to a N-type constant-current control-voltage VNG, then the drains produce a constant current.

The drains of the first common-sourced NMOS transistor set 304 and the second common-sourced NMOS transistor set 314 are coupled to the second constant-current source 303 and the fourth constant-current source, respectively. The gates and the drains are self cross-coupled, i.e., the gate of 304 is coupled to the drain of 314, and the gate of 314 is coupled to the drain of 304.

The first LC tanks 305 and second LC tanks 315 are both for generating constant-frequency signals. The first LC tank 305 is connected to the fist common-sourced PMOS transistor set 302 and the first common-sourced NMOS transistor set 304 in series. The second LC tank 315 is connected to the fist common-sourced PMOS transistor set 312 and the first common-sourced NMOS transistor set 314 in series. These circuits of the two LC tanks can be obtained from combination of the inductor-coils and capacitors in series. Signals (or noises) of specific frequency are first selected by the LC tanks and then by amplify effect of the above connection circuits, and these form oscillation circuit. Four quadrature signals are generated by the symmetrization of the circuit.

Figure 4:
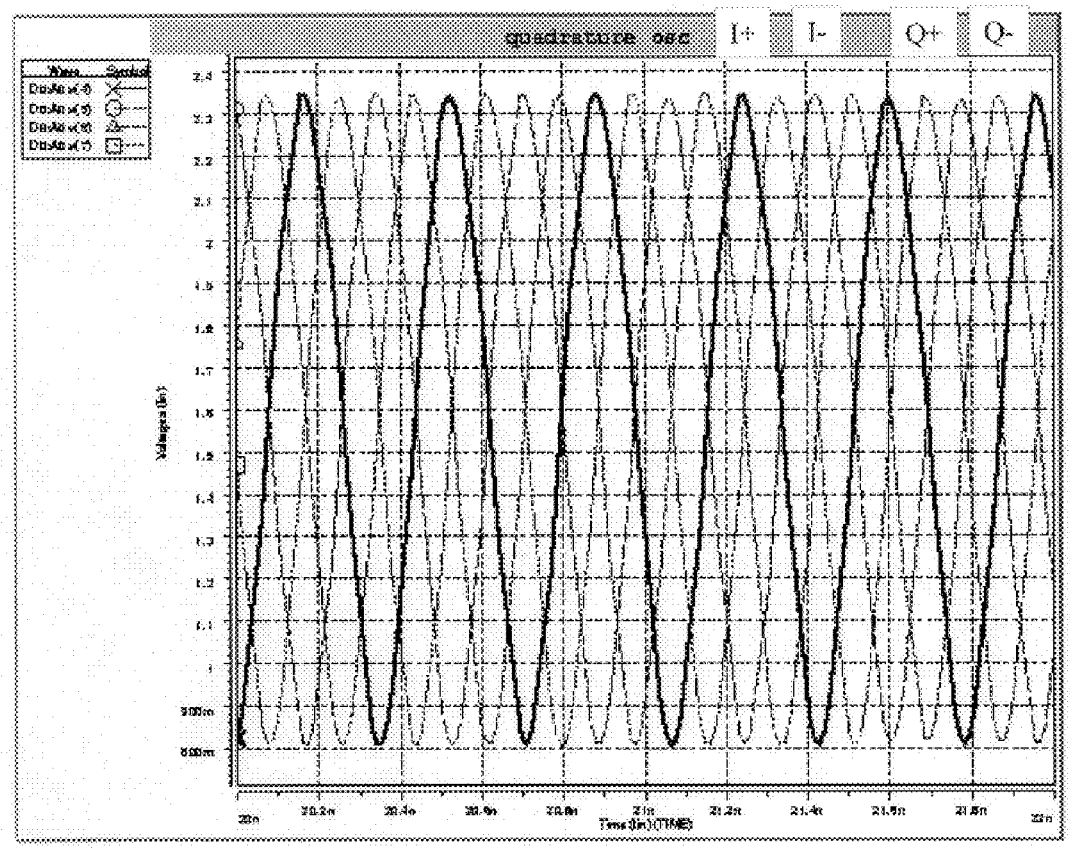
FIG. 4 shows the output quadrature signals of the quadrature oscillator from the disclosed invention.
Figure 5:
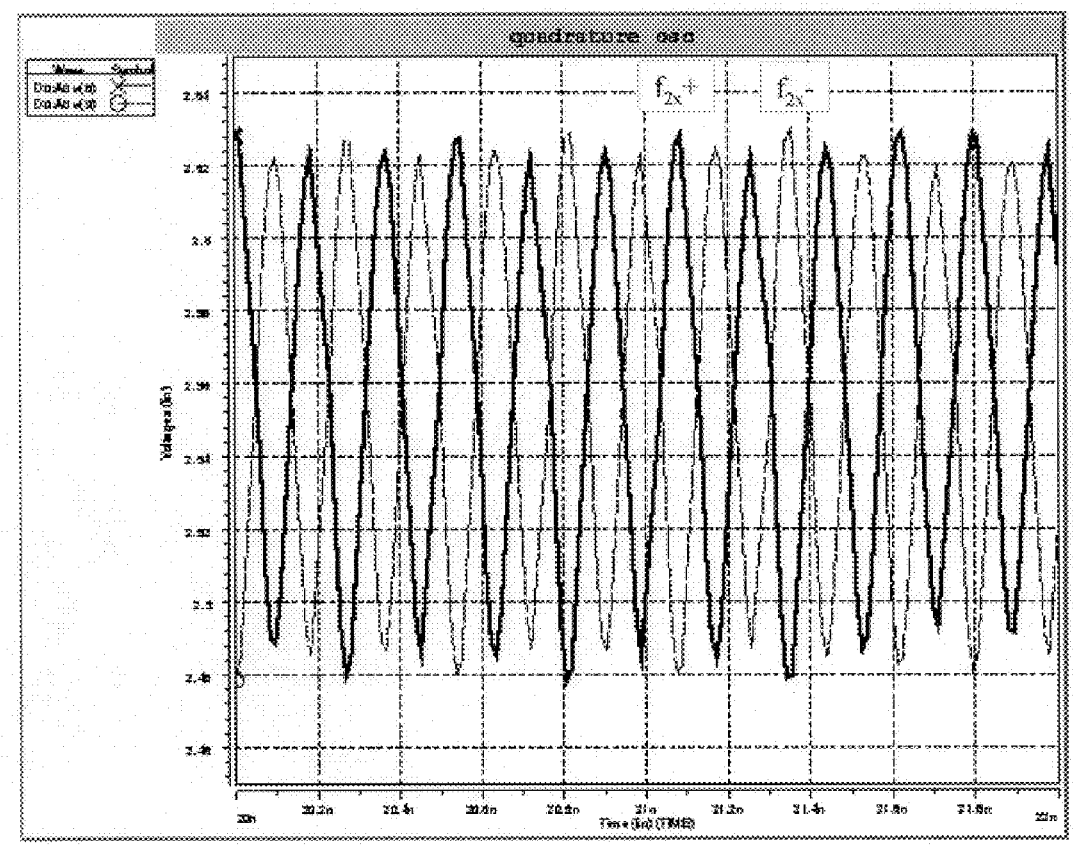
FIG. 5 shows the output double-frequency signals of the quadrature oscillator from the disclosed invention.

Referring to FIG. 4, the output quadrature signals of the quadrature oscillator from the technique disclosed by this invention. The first LC tank 305 and the second LC tank 315 can both generate signals of constant frequency f. Inputting the signal to the feedback circuit, which is formed by the first common-sourced PMOS transistor set 302 and the second common-sourced PMOS transistor set 312, then we get four output signals at the first output terminal 306, the second output terminal 307, the third output terminal 316 and the fourth output terminal 317, i.e. quadrature signals.

By the additive property of inputting signal at the common-sourced terminal of the differential transistor set, we thus can get the double-frequency output. This invention can generate quadrature signals, in addition, can also generate signal of frequency 2f at the output terminal 308 and 318. The frequency is double to the constant frequency generated from the first LC tank 305 and the second LC tank 315, i.e. the double-frequency signal.

Figure 1:
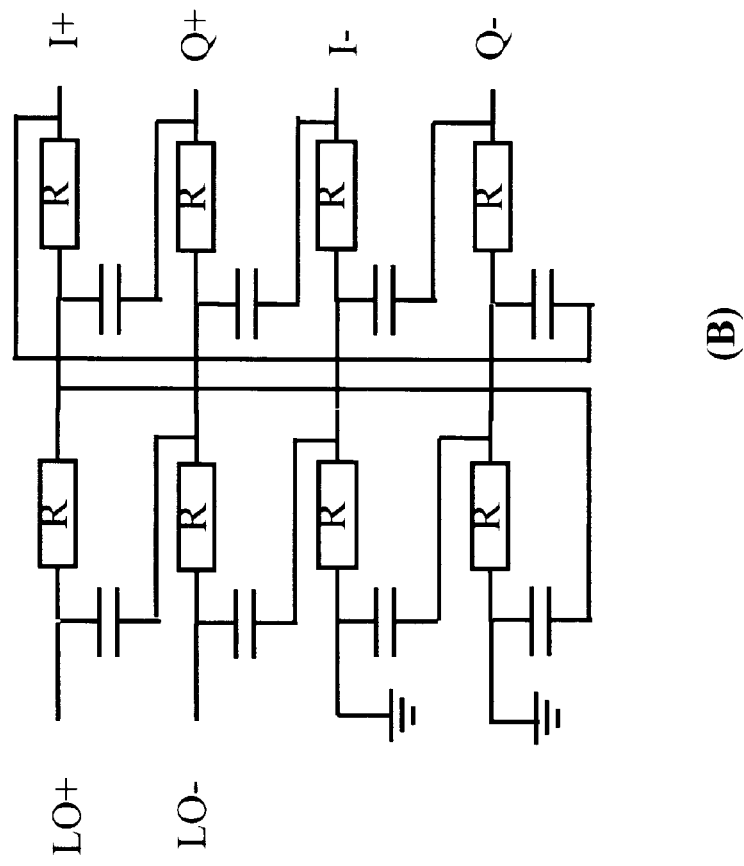
FIG. 1(A) is the conventional quadrature generator formed by the RC phase shifters;(B) is the conventional quadrature generator formed by the poly-phase filters.
Figure 1:
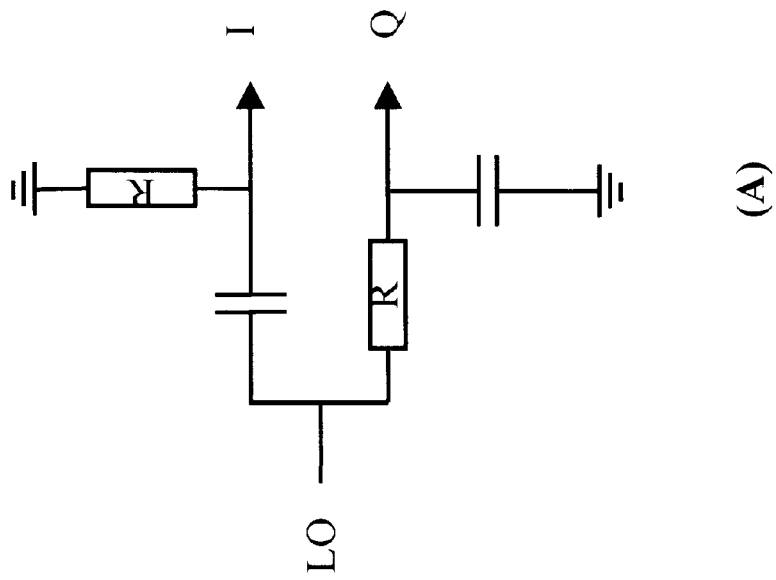
Figure 2:
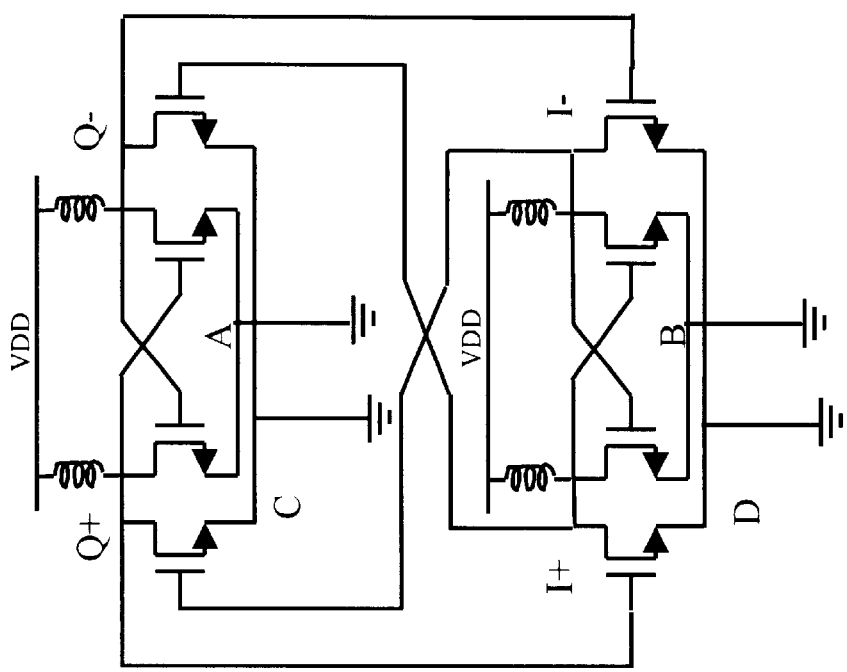
FIG. 2 is a conventional generator formed by the differential oscillators.

The difference between the conventional quadrature generator (as showed in FIG. 2) formed by conventional differential oscillators and the present invention is that the conventional one requires four inductors, however, the present one needs only two inductors. Under not to be the optimization consideration for inductor design, it can always reduce the area for circuit design.

This invention use the current-reuse technique, first input current from the first constant-current source 301 to the first common-sourced PMOS transistor set 302 and the first common-sourced NMOS transistor set 304, then the current goes through the second constant-current source 303; similarly, we first input current from the third constant-current source 311 to the second common-sourced PMOS transistor set 312 and the second common-sourced NMOS transistor set 314, then the current goes through the fourth constant-current source 313. Because the current reuse for many devices, therefor, the present invention has lower power dissipation.

Figure 6:
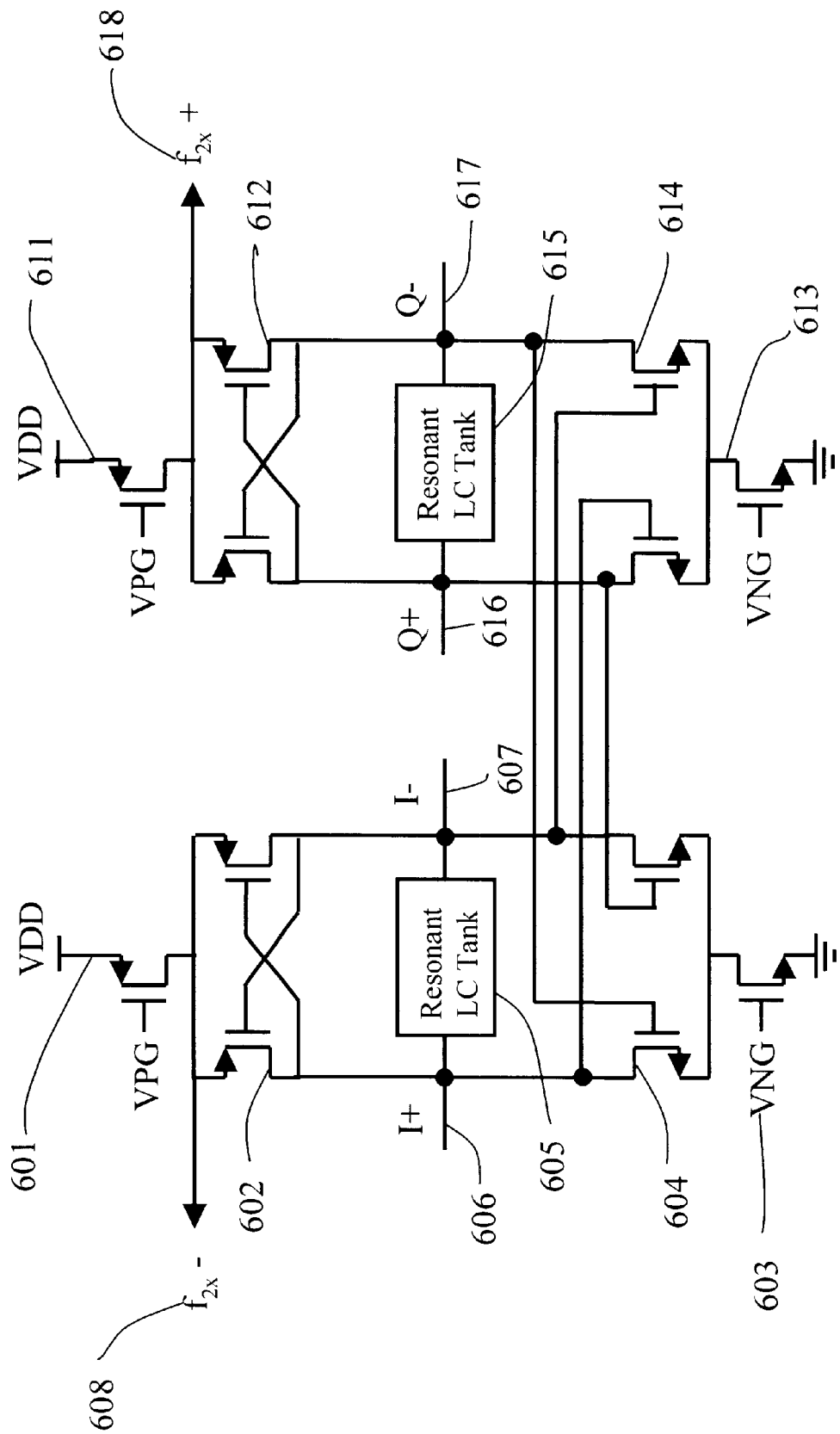
FIG. 6 is the second example of the quadrature oscillator according to the disclosed invention.

Referring now to FIG. 6, the second example of the quadrature oscillator, which is disclosed by this invention, includes same device as described in the first example, i.e. FIG. 3. The differences, between the first and second examples, are that the gate and drain terminals of the first common-sourced PMOS transistor set 604 and second common-sourced PMOS transistor set 614 are self cross-coupled; similarly, the gate and drain terminals of the first common-sourced PMOS transistor set 602 and second common-sourced PMOS transistor set 612 are self cross-coupled, and thus form the feedback circuit. The mechanism, purpose and efficiency are as same as those in the first example.

Figure 7:
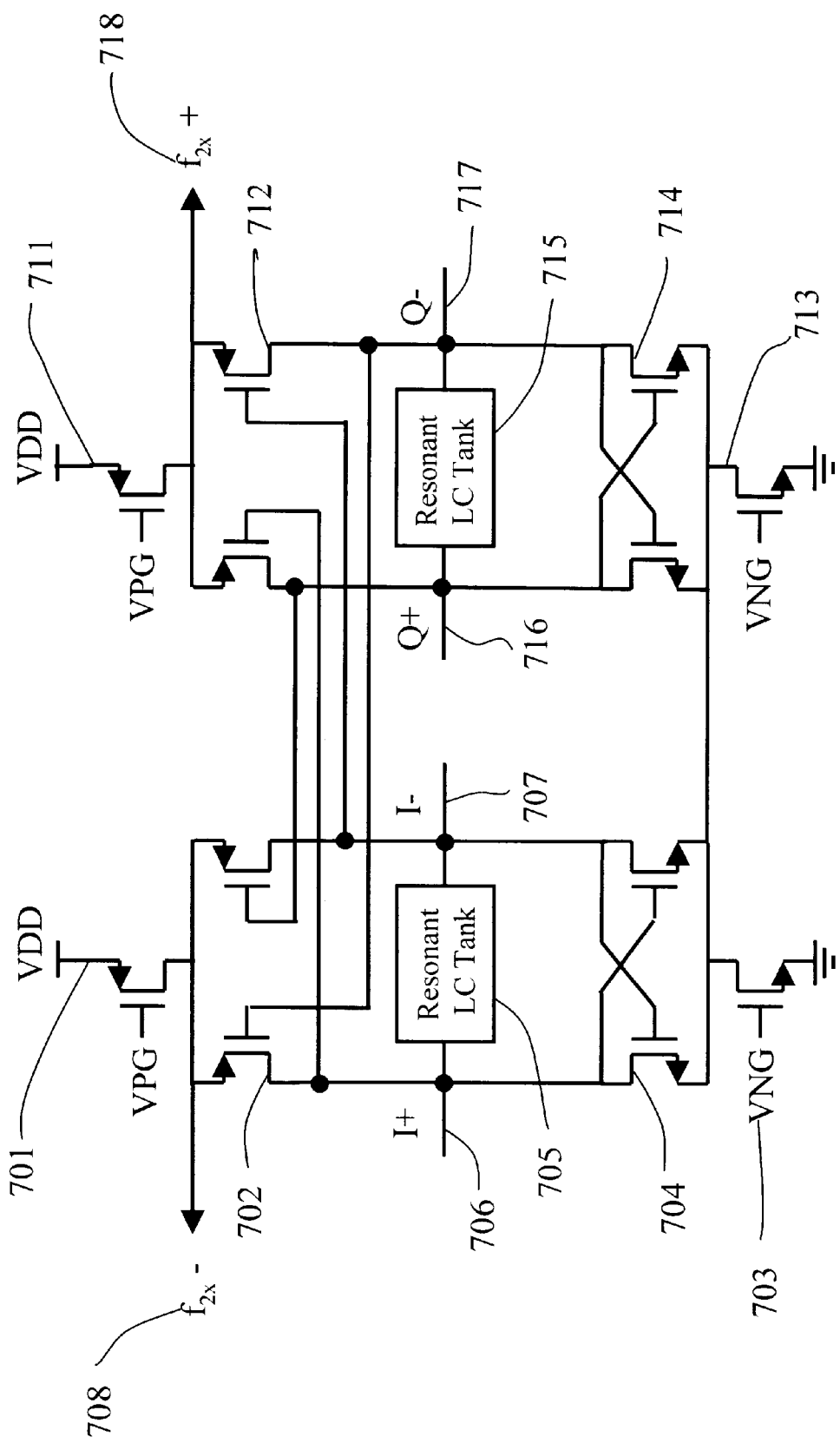
FIG. 7 is the third example of the quadrature oscillator according to the disclosed invention.

Referring now to FIG. 7, the third example of the quadrature oscillator, which is disclosed by this invention, the components are same as those of the first example, i.e. FIG. 3. The difference is that the drain of the second constant-current source 703 is coupled to the drain of the fourth constant-current source 713.

Contrast to the drain of the second constant-current source 703, the drain of the fourth constant-current source 713 is similar to an equivalent capacitor, vise versa. From the above outputs of double-frequency are differential, we thus know that the voltage of the drain of the fourth constant-current source will drop as the voltage of the drain of the second constant-current source raised. By coupling the drains of the second constant-current source 703 and the fourth constant-current source 713, the (electric) potential of these two terminals tends to be equilibrium, it will help to improve the phase noise. However, differing to the conventional techniques of quadrature differential oscillators, the present can also get signals of 2f frequency from the positive double-frequency output terminal 708 and the negative double-frequency output terminal 718.

Figure 8:
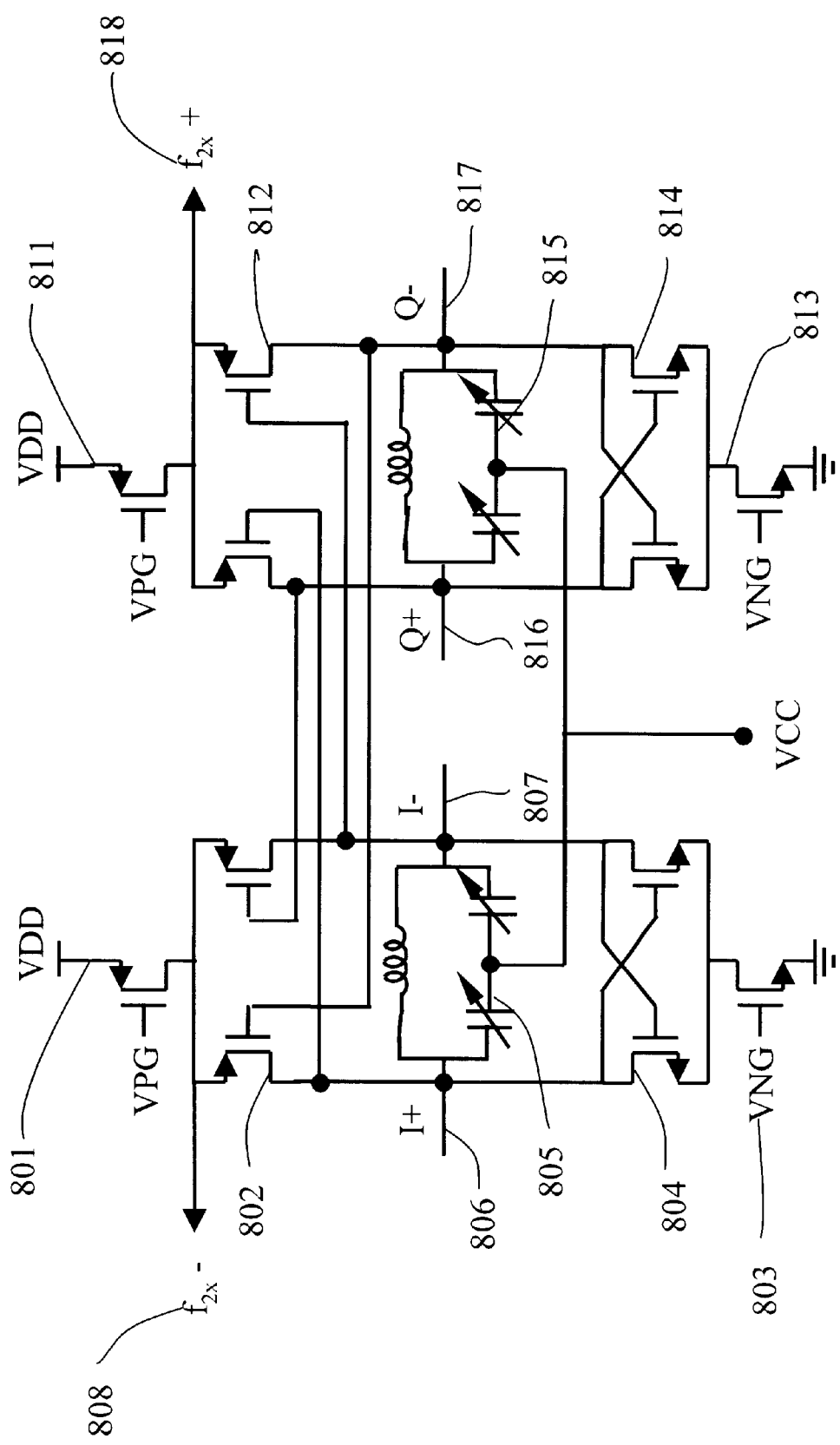
FIG. 8 is the forth example of the quadrature oscillator according to the disclosed invention.

Referring now to FIG. 8, the fourth example of the quadrature oscillator, which is disclosed by this invention, the components are with those as described in the first example, i.e. FIG. 3. The differences, between the first and fourth examples, are that the capacitors of wherein the first LC tank 805 and second LC tank 815 are formed by two variable capacitors in series.

By changing the voltage between the capacitors of the first and second LC tanks, we can change the equivalent value of any LC tank, and further change the frequency of the output signals, and this is one of the advantages of this invention by providing variable oscillation frequency.

What is claimed is:

1. A quadrature oscillator for generating quadrature signals which have 90 degrees out of phase, comprising:

a first constant-current source for providing a constant current;

a first common-sourced P-type metal oxide semiconductor (PMOS) transistor set formed by coupling the sources of two PMOS transistors with said first constant-current source;

a second constant-current source for providing a constant current;

a first common-sourced N-type metal oxide semiconductor (NMOS) transistor set having two NMOS transistors, wherein the source of each of the NMOS transistors is coupled to said second constant-current source, and the gates and the drains of the NMOS transistors are cross-coupled;

a first LC tank connected to said first common-source PMOS transistors set and said first common-source NMOS transistors set in parallel for generating a constant frequency signal;

a third constant-current source for providing a constant current; a second common-sourced PMOS transistor set having two PMOS transistors the source of which being coupled to said third constant-current source, the drain being coupled to the gate of said first common-sourced PMOS transistor set, and the gate being coupled to the drain of said first common-sourced PMOS transistor set;

a fourth constant-current source for providing a constant current;

a second common-sourced NMOS transistor set having two NMOS transistors the sources of which are coupled to said fourth constant-current source, and the gate and the drain are cross-coupled; and a second LC tank connected to said second common-sourced PMOS transistor set and said second common-sourced NMOS transistor set in parallel for generating a constant frequency signal.

2. A quadrature oscillator according to claim 1, wherein said first constant-current source is formed from a PMOS transistor the source and gate of which are connected to a constant voltage and a P-type constant-current control-voltage, respectively, and then output a constant current at the drain.

3. A quadrature oscillator according to claim 1, wherein said third constant-current source is formed from a PMOS transistor the source and gate of which are connected to a constant voltage and a first fixed reference voltage, respectively, and then output a constant current at the drain.

4. A quadrature oscillator according to claim 1, wherein said second constant-current source is formed from a NMOS transistor the source and gate of which are connected to the ground and a second fixed reference voltage, respectively, and then output a constant current at the drain.

5. A quadrature oscillator according to claim 1, wherein said fourth constant-current source is formed from a NMOS transistor the source and gate of which are connected to the ground and a second fixed reference voltage, respectively, then output a constant current at the drain.

6. A quadrature oscillator according to claim 1, wherein said first LC tank is formed of at least an inductor and a capacitor connected in series.

7. A quadrature oscillator according to claim 1, wherein said second LC tank is formed of at least an inductor and a capacitor connected in series.

8. A quadrature oscillator according to claim 7, wherein the capacitor in said first LC tank is coupled to the capacitor of said second LC tank to form a control-voltage terminal for varying the capacitor.

9. A quadrature oscillator according to claim 1, wherein the drain of said second constant-current source is coupled to said fourth constant-current source.

10. A quadrature oscillator for generating quadrature signals which have 90 degrees out of phase, at least comprising:

a first constant-current source for providing a constant current;

a first common-sourced P-type metal oxide semiconductor (PMOS) transistor set having two PMOS transistors, wherein the source of each of the PMOS transistors is coupled to said first constant-current source, and the gates and the drains of the PMOS transistors are cross-coupled;

a second constant-current source for providing a constant current;

a first common-sourced N-type metal oxide semiconductor (NMOS) transistor set formed by coupling the sources of two NMOS transistors with said second constant-current source;

a first LC tank connected across the drain nodes of said first common-source PMOS transistor set and said first common-source NMOS transistor for generating a constant frequency signal;

a third constant-current source for providing a constant current;

a second common-sourced PMOS transistor set having two PMOS transistors the sources of which are coupled to said third constant-current source, and the gate and the drain are cross-coupled; and a fourth constant-current source for providing a constant current;

a second common-sourced NMOS transistor set having two NMOS transistors the source of which being coupled to said fourth constant-current source, the drain being coupled to the gate of said first common-sourced NMOS transistor set, and the gate being coupled to the drain of said first common-sourced NMOS transistor set;

a second LC tank connected to said second common-sourced PMOS transistor set and said second common-sourced NMOS transistor set in parallel for generating a constant frequency signal.

11. A quadrature oscillator according to claim 10, wherein said first constant-current source is formed from a PMOS transistor the source and gate of which are connected to a constant voltage and a P-type constant-current control-voltage, respectively, and then output a constant current at the drain.

12. A quadrature oscillator according to claim 10, wherein said third constant-current source is formed from a PMOS transistor the source and gate of which are connected to a constant voltage and a first fixed reference voltage, respectively, and then output a constant current at the drain.

13. A quadrature oscillator according to claim 12, wherein said second constant-current source is formed from a NMOS transistor the source and gate of which are connected to the ground and a second fixed reference voltage, respectively, and then output a constant current at the drain.

14. A quadrature oscillator according to claim 12, wherein said fourth constant-current source is formed from a NMOS transistor the source and gate of which are connected to the ground and a second fixed reference voltage, respectively, then output a constant current at the drain.

15. A quadrature oscillator according to claim 10, wherein said first LC tank is formed of at least an inductor and a capacitor connected in series.

16. A quadrature oscillator according to claim 10, wherein said second LC tank is formed of at least an inductor and a capacitor connected in series.

17. A quadrature oscillator according to claim 16, wherein the capacitor in said first LC tank is coupled to the capacitor of said second LC tank to form a control-voltage terminal for varying the capacitor.

18. A quadrature oscillator according to claim 10, wherein the drain of said second constant-current source is coupled to said fourth constant-current source.

* * * * *